US010727867B2

(12) United States Patent
Ben-Rubi et al.

(10) Patent No.: US 10,727,867 B2
(45) Date of Patent: Jul. 28, 2020

(54) ERROR CORRECTION DECODING AUGMENTED WITH ERROR TRACKING

(71) Applicant: Western Digital Technologies, Inc., San Jose, CA (US)

(72) Inventors: Refael Ben-Rubi, Rosh Haayin (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 45 days.

(21) Appl. No.: 16/021,857

(22) Filed: Jun. 28, 2018

(65) Prior Publication Data

US 2020/0004628 A1   Jan. 2, 2020

(51) Int. Cl.
  *H03M 13/11*  (2006.01)
  *G06F 11/10*  (2006.01)
  *G06F 12/0866*  (2016.01)
  *G06F 3/06*  (2006.01)

(52) U.S. Cl.
  CPC ......... *H03M 13/1102* (2013.01); *G06F 3/064* (2013.01); *G06F 3/068* (2013.01); *G06F 3/0619* (2013.01); *G06F 3/0652* (2013.01); *G06F 11/1004* (2013.01); *G06F 11/1076* (2013.01); *G06F 12/0866* (2013.01); *G06F 2212/1032* (2013.01)

(58) Field of Classification Search
  CPC ............ G06F 11/1076; G06F 11/1088; G06F 11/1004; G06F 3/0619; G06F 3/064; G06F 3/0652; G06F 3/068; H03M 13/1102; H03M 13/1111; H03M 13/09; H03M 13/3723
  See application file for complete search history.

(56) References Cited

U.S. PATENT DOCUMENTS

| 6,192,499 | B1 * | 2/2001 | Yang | G11B 20/10527 714/785 |
| 2006/0253767 | A1 * | 11/2006 | Winarski | G06F 11/1088 714/755 |

* cited by examiner

*Primary Examiner* — Shelly A Chase

(57) ABSTRACT

Enhanced error correction for data stored in storage devices are presented herein. A storage controller retrieves an initial encoded data segment stored on a storage media, computes information relating to errors resultant from decoding the initial encoded data segment, and stores the information in a cache. The storage controller retrieves subsequent encoded data segments stored on the storage media, augments a decoder using at least the information retrieved from the cache, and decodes the subsequent encoded data with the decoder to produce resultant data.

25 Claims, 5 Drawing Sheets

ERROR CORRECTION DECODING AUGMENTED WITH ERROR TRACKING

TECHNICAL FIELD

Aspects of the disclosure are related to the field of data storage, particularly to error correction during decoding of data stored on storage devices.

BACKGROUND

Computing systems typically employ data storage systems for storage and retrieval of data accessed by users. Various types of storage devices can be employed in these data storage systems, such as hard disk drives (HDDs) or solid-state drives (SSDs), among others. SSDs employ various underlying storage technology, such as NAND flash arrays. Payload data stored in these arrays is typically encoded using various error correction codes to ensure more reliable data storage despite random read/write errors, interfacing errors, and physical flaws in the underlying storage media. However, these error correction codes consume finite computing resources and take time to converge to corrected data values during data read decoding.

Media and latency limitations of certain computer/server types or data access styles might preclude encoding data with large error correction overheads, due in part to latency involved in decoding processes. For example, many users who use Internet services access content storage in specific ways, where content is initially written and then that same content is read many times when different clients need to consume the same content. Such applications can include sharing of popular songs or videos on content websites that are read many thousands of times in close temporal proximity to one another. Moreover, content media servers and systems many times forgo large random-access memory (RAM) caches in lieu of large data storage devices due in part to cost.

Overview

Enhanced error correction for data stored in storage devices are presented herein. A storage controller retrieves an initial encoded data segment stored on a storage media, computes an indication of error locations resultant from decoding the initial encoded data segment, and stores the indication of the error locations in a cache. The storage controller retrieves subsequent encoded data segments stored on the storage media, augments a decoder using at least the indication of the error locations retrieved from the cache, and decodes the subsequent encoded data with the decoder to produce resultant data.

In another example, a storage controller retrieves an initial encoded data segment stored on a storage media, computes an indication of error rate and compares it to a threshold. When the error rate exceeds the threshold, the storage controller generates a secondary set of parity bits for the data segment and stores the extra parity bits in a cache or in the storage media to be used in consecutive reads of the data segment.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Content servers are deployed in many settings to provide data to various end users. These content servers might have various processing systems, memory, and data storage devices. When content stored by the content servers is provided to end users, this content can be temporarily cached into memory from archival storage devices to reduce latency in delivery of the content. However, including memory into content servers can be expensive when large content files are employed, such as video, audio, and other such data. Unfortunately, serving content directly from archival storage devices can lead to longer latency, due in part to delays incurred in decoding data stored on underlying storage media of those archival storage devices.

Storage devices employed in computing systems, such as content servers, have an underlying physical media upon which data can be written. Typically, this data is received from a source device in an unencoded form, and this data might be subsequently encoded prior to media writing using an error correction code (ECC) or other data protection scheme. In some examples, redundancy data or redundancy information can accompany the data on the storage media. Different types of storage media might have different error correction types applied, or different variants of the same error correction. For example, a memory device might employ Bose-Chaudhuri-Hocquenghem (BCH) codes or low-density parity-check (LDPC) codes, among others, to ensure more reliable data storage and compensate for random or transient read/write errors, interfacing errors, and physical flaws in the underlying storage media. Although these error correcting processes might lead to more reliable data storage and retrieval, reading content directly from data storage devices to service end users can be troublesome. Moreover, including larger and larger RAM caches into content servers can lead to increased expense for commodity servers and force added hardware complexity into content servers.

Discussed herein are enhanced systems, methods, and control architectures for providing content or data directly from archival storage devices without incurring as large of latency penalties. Specifically, one or more portions of a data storage device can be designated as a "read enhanced" portion which has data read using enhanced lower-latency error correction techniques. Thus, content servers and other associated computing systems can be built using less on-board RAM to cache content served to end users by host systems. Advantageously, many benefits can arise from these enhanced techniques, such as reduced latency in providing data to end users, more immunity to power failures than RAM caching, as well as delaying or foregoing certain storage media maintenance operations, including read scrub operations.

Figure 1:
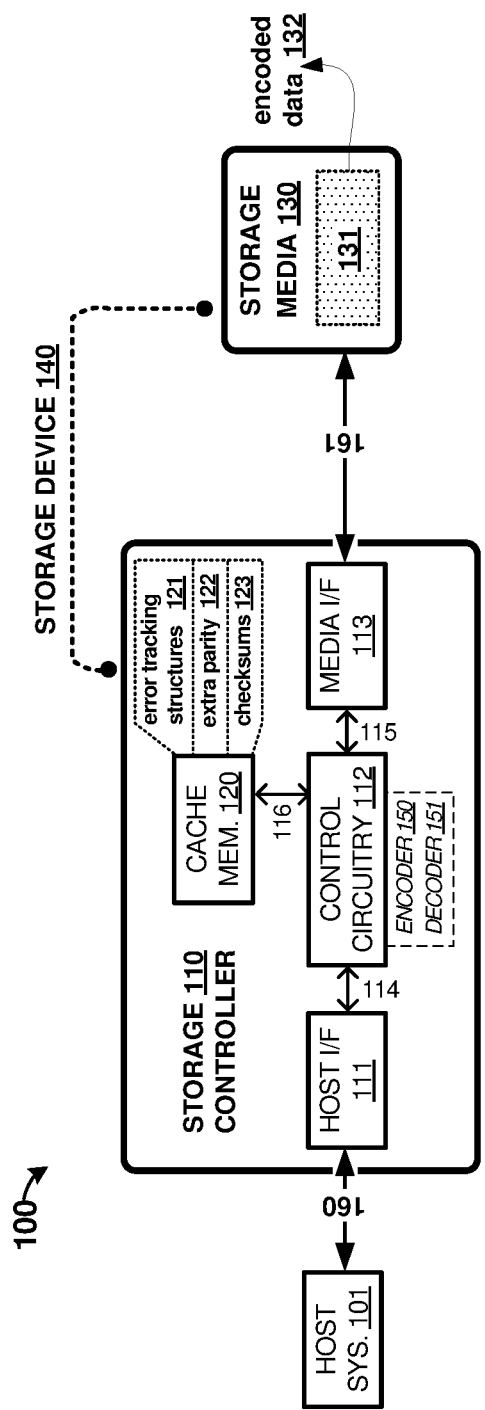
FIG. 1 illustrates an example data storage system.

Turning now to a first example of enhanced data storage and retrieval operations, FIG. 1 is presented. FIG. 1 is a system diagram illustrating computing system 100. Computing system 100 includes storage controller 110 and storage media 130, which together can form data storage device 140. Storage controller 110 can communicate with one or more external systems, such as host system 101, over link 160. Storage controller 110 and storage media 130 can communicate over link 161. Storage controller 110 includes host interface 111, control circuitry 112, media interface 113, and cache memory 120. Elements of storage controller 110 communicate over internal links 114-116. Control circuitry 112 can include encoder 150 and decoder 151 in some examples.

A host system, not shown in FIG. 1 for clarity, might include dynamic random-access memory (DRAM) for use in executing software on the host system. In other examples, this DRAM is included in a storage drive instead of a host system. This DRAM might be employed for caching data read from a storage drive, such as storage device 140. Using the enhanced techniques discussed herein, the quantity of DRAM might be reduced or eliminated, and any remaining DRAM might only be used to execute software processes on the associated local device instead of caching data provided to end users by host systems. Thus, storage device 140 can provide data to end users with low enough latency to avoid using DRAM caching of this content in the storage device or host system. Such devices and systems can be referred to as "DRAM-less" (even though some DRAM might be employed for internal processing operations of the device/system). It should be understood that the operations and elements discussed herein for FIG. 1 are not limited to any particular memory technology or storage media.

In operation, data is transferred over link 160 for storage by storage device 140. This data is received by host interface 111 and control circuitry 112 encodes this data into encoded data segments for storage onto storage media 130 as encoded data 132. Control circuitry 112 might employ encoder 150 to encode this data into the encoded data segments. Media interface 113 provides encoded data segments for storage onto storage media 130 as encoded data 132, such as by employing various interfacing circuitry for the physical storage media comprising storage media 130.

During retrieval of data previously stored onto storage media 130, encoded data 132 is read from storage media 130 over link 161 by media interface 113. Control circuitry 112 decodes this data read from storage media 130 into one or more decoded data segments using an error correction scheme. In one example enhancement, control circuitry 112 also monitors the decode process used to produce the one or more decoded data segments to determine locations of errors that occur within the data. These locations of errors comprise error location information or error location indications which are produced by a decoder and can be referred to herein as decoding error location information. Control circuitry 112 assembles indications of these error locations into one or more error tracking structures 121. These error tracking structures can include an error location index, error location array, or error vector. Errors encountered during decode can be typically corrected using the error correction scheme, and the decoded data is subsequently provided over host interface 111 and link 160.

However, for subsequent read operations to the same storage locations of storage media 130, control circuitry 112 can employ the information included in error tracking structures 121 to augment decoding of encoded data segments read from storage media 130. This augmentation of decoding can comprise configuring or revising an error correction scheme or error correction process with information included in error tracking structures 121. For example, error tracking structures 121 can indicate locations within the data of previous errors during previous decode operations. The error correction process can use these locations to indicate a high probability of errors for present data decoding to help the error correction process perform faster decodes.

In other examples, extra check bits, referred to herein as extra parity bits, can be generated instead of (or in addition to) tracking error locations in error tracking structures 121. Although data structures used in error tracking structures 121 can be modified to store these extra parity bits instead of error location information, it should be understood that other storage locations and data structures can be employed to store parity bits. In FIG. 1, these extra parity bits can include extra parity data 122. These extra parity bits can be calculated responsive to decoding errors during previous decode operations. For example, control circuitry 112 retrieves an initial encoded data segment stored on storage media 130, computes an indication of an error rate during the decode process, and compares it to an error rate threshold. When the error rate exceeds the error rate threshold, control circuitry 112 generates extra parity bits for the initial encoded data segment and stores the extra parity bits as extra parity data 122 in cache memory 120 to be used in subsequent reads of the encoded data segment. control circuitry 112 can store the extra parity bits with one or more indicators that relate the extra parity bits to the particular encoded data segment to which the extra parity bits relate. These indicators can include a storage address or other indicator. Later, these extra parity bits can augment an error correction process by acting as further parity bits or parity data to help the error correction process perform faster decodes. Even if subsequent reads produce different error locations (e.g. some errors are flipped back and some correct bits become erroneous), these extra parity bits can still be employed in the decode process. Moreover, when extra check bits are employed, read scrub operations can be delayed longer than usual, due in part to the data storage locations associated with the previous decode errors having these extra check bits.

Various techniques can be used to update the error tracking structures after each decode process, so that new errors can be accounted for, and random errors that no longer occur can be eliminated from tracking. Checksums 123 can be generated for each version of error tracking structures 121 to compare whether or not new errors have been found in decoding operations.

Figure 2:
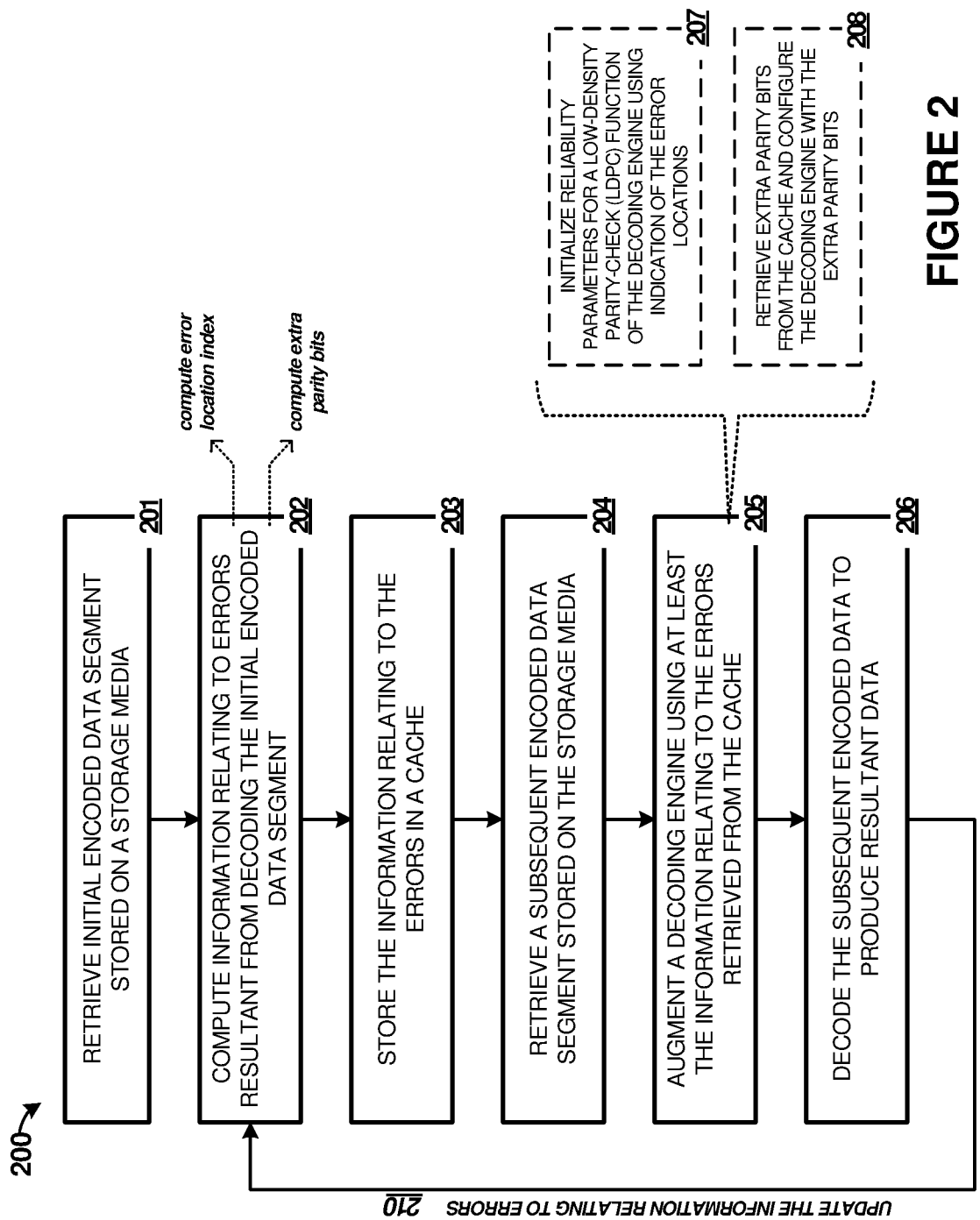
FIG. 2 illustrates an example operation of a data storage system.

Turning now to a more detailed discussion on the decoding and error correction process noted above, FIG. 2 is presented. FIG. 2 is a flow diagram illustrating an example operation of elements of system 100 in FIG. 1. The operations of FIG. 2 are discussed in the context of elements of FIG. 1. However, it should be understood that the operations of FIG. 2 can instead be employed by any of the various storage system examples herein.

In FIG. 2, data is received by storage controller 110 for storage onto storage media 130. This data can be received over link 160 by host interface 111. Control circuitry 112 can encode this data using encoder 150 into one or more encoded data segments for storage on storage media 130 via media interface 113. Once stored onto storage media 130, this data can later be retrieved. For example, a read command or read operation might be received over link 160 and control circuitry 112 can responsively retrieve encoded data segments that correspond to storage addressing indicated by the read operation. Thus, control circuitry 112 retrieves (201) an initial encoded data segment stored on storage media 130. This initial encoded data segment can be read from the physical media of storage media 130 by media interface 113 and presented to control circuitry 112 over link 115.

From here, control circuitry 112 can employ decoder 151 to decode the initial encoded data segment into decoded data for transmission to the requesting entity over link 160 and host interface 111. Decoder 151 of control circuitry 112 processes the encoded data segment into decoded data using a selected error correction scheme. Example error correction schemes include low-density parity-check (LDPC) types of error correcting code (ECC), among others, which can ensure reliable payload data storage despite random read/write errors, interfacing errors in media interface 113, and physical flaws in storage media 130. The selected error correction scheme used to decode the encoded data segment typically has a quantity of errors that can be corrected in the encoded data segment before uncorrectable errors surface. Uncorrectable errors indicate data loss for bits that correspond to the uncorrectable errors.

Responsive to the decode process employed by decoder 151, control circuitry 112 computes (202) information relating to errors resultant from decoding the initial encoded data segment. In a first example, the information relating to errors can comprise bit locations of errors within the encoded data segments encountered during decoding. Indications of the error locations can be included in one or more data structures. An example data structure can be referred to herein as an error location index that indicates which bits in an encoded data segment are computed as erroneous during decode of the encoded data segment. The error location index can comprise a bit vector of a similar size as an encoded data segment with 1's indicating where bit errors were computed in the corresponding encoded data segment. The error location index, in one embodiment, can instead be more compact that the noted bit vector, and indicate locations within an encoded data segment that have encountered decode errors. Although errors encountered during decode might be correctable using the error correction scheme employed to encode/decode the data, indications of the error locations are still maintained by control circuitry 112 in one or more data structures, such as the error location index mentioned above.

However, various other data structures can be employed, which may be equivalent from a functional standpoint to an error location index. For example, an error location array might be employed which lists bit or byte locations within encoded data segments of errors encountered during decode processes. In another example, an error vector is employed. This error vector can similarly comprise indications of bit errors encountered during the decode process as related to locations of bit errors in the encoded data segments. Other data structures can be employed to track and relate bit errors from decode processing to locations within associated encoded data segments. Error tracking structures 121 represent any such data structures.

Moreover, many encoded data segments corresponding to different storage locations on storage media 130 might be decoded over time. Error tracking structures 121 can comprise arrays of error vectors or error location indexes, each of which correspond to a different storage location or storage address of storage media 130. Thus, error tracking structures 121 can include individual error location indexes for each storage location of storage media 130 having a corresponding encoded data segment. Each read operation received by control circuitry 112 can include a corresponding read address that indicates a storage location on storage media 130. Storage locations of storage media 130 indicated in error tracking structures 121 can thus be employed to correlate initial read operations and decode errors to subsequent read operations.

Control circuitry 112 stores (203) the information relating to the errors in cache memory 120, such as the indication of the error locations. The indication of the error locations might comprise an index of one or more bytes with offsets of the error bits within the bytes. In FIG. 1, this can be achieved by creating or updating an error location index in error tracking structures 121 in cache memory 120 over link 116. In the discussion for FIG. 2, the indication of the error locations will be referred to as an error location index. The error location index is stored on a separate storage medium or storage device than the encoded data segments. Error tracking structures 121 might comprise a single error location index or more than one error location index. The quantity of bits indicated in the error location index can vary, and the sizes of encoded data segments read from storage media 130 can vary. However, in a specific example, the error location index might contain locations of 100 errors for each encoded data segment, with 2 bytes per error, totaling 200 bytes for each encoded data segment. The encoded data segments might be 4 kilobytes (4 k) in size in such an example. The quantity of bytes per error might vary according to the technology used to form the storage media. For example, triple-level flash memory cells (TLC) might employ 2 bytes per error, while single-level flash memory cells (SLC) might employ 1 byte per error.

Storage controller 110 might receive subsequent read operations over time, which might be addressed to similar storage locations as the initial read operation discussed above. Responsive to at least a subsequent read operation, control circuitry 112 retrieves (204) a further encoded data segment stored on storage media 130. This further encoded data segment can be read from the physical media of storage media 130 by media interface 113 and presented to control circuitry 112 over link 115. From here, control circuitry 112 can employ decoder 151 to decode (206) the further encoded data segment into further decoded data for transmission to the requesting entity over link 160 and host interface 111. Control circuitry 112 can then transmit the further decoded data to the requesting entity over link 160 and host interface 111. Decoder 151 of control circuitry 112 processes the further encoded data segment into the further decoded data using the selected error correction scheme, such as the LDPC type of error correcting code (ECC) discussed above.

However, during the decode process, control circuitry 112 augments (205) a decoding engine, namely decoder 151, using at least the information relating to the errors. As mentioned above, the information relating to the errors might comprise the indication of the error locations retrieved from cache memory 120. The augmentation employed by control circuitry 112 and decoder 151 can reduce latency in decoding further encoded data segments, or produce resultant decoded data faster and more reliably than without the augmentation. In operation 203, an error location index can be stored by cache memory 120 in error tracking structures 121 for later retrieval. Control circuitry 112 retrieves this error location index and performs a decode process using at least a portion of the error location index to enhance or augment decoding of the further encoded data segment, as well as even further encoded data segments. Control circuitry 112 might temporarily store the error location index in RAM or other memory for faster access once read from cache memory 120. In some examples, a portion of cache memory 120 can comprise RAM or volatile memory into which the error location index can be stored during operation of decoder 151. This error location index can be periodically backed up to non-volatile memory in other portions of cache memory 120 to provide storage of the error location index during power interruptions.

In this first example augmentation type comprising a first augmentation operation, a decoding process of decoder 151 is configured using the information relating to the errors, which comprises the error location index, to initialize parameters for decoding of the further encoded data segments. The configuration of decoder 151 using the error location index can be referred to herein as revising a decoding scheme provided by decoder 151 based at least in part on the error location index. Specifically, decoder 151 initializes (207) reliability parameters for a LDPC function of the decoding engine using the error location index. These reliability parameters for the LDPC decode process can be initialized with locations of previous errors from decoding previous encoded data segments, which are indicated as a high probability of further errors by using the error location index. The LDPC decode process, among other ECC types, can inform a decoder which bits to decode and assign reliability of those bits. During decode, the reliability can indicate to decoder 151 to work on decoding those affected bits first, such as by flagging certain bit locations in data to be decoded before other bits. This flagging can aid in convergence onto corrected bit values during the decode process. Thus, the error location index can indicate data byte locations in data stored on storage media 130, with bit offsets localizing errors resultant from decoding one or more prior read operations. Subsequent reads to similar storage locations might produce similar errors, such as bit errors during decode. Knowledge of the locations of prior errors indicated by the error location index can be employed by decoder 151 to increase a decode speed or accuracy when determining decoded data.

In a second example augmentation type comprising a second augmentation operation, instead of (or in addition to) the error location index techniques, the information relating to the errors comprises extra parity bits that are calculated for encoded data segments. The term extra parity bits as used herein relates to parity bits calculated for an encoded data segment that are in addition to any parity stored with that encoded data segment during storage on storage media 130. These extra parity bits can be stored in cache memory 120 as extra parity 122. Decoder 151 is configured using the extra parity bits, and can be referred to herein as revising a decoding scheme provided by decoder 151 based at least in part on the extra parity bits. These extra parity bits might be calculated during operation 202, as noted in FIG. 2.

One or more extra parity bits are calculated for a given encoded data segment responsive to a quantity of errors encountered during decoding of that encoded data segment. When this quantity of errors exceeds a predetermined error threshold, then extra parity bits can be calculated for the corresponding encoded data segment. As with the error location index, the extra parity bits can be stored by cache memory 120 for later retrieval. Control circuitry 112 stores these extra parity bits as extra parity 122 in FIG. 1. Control circuitry 112 retrieves the extra parity bits and performs a decode process using at least a portion of the extra parity bits to enhance or augment decoding of the further encoded data segment, as well as even further encoded data segments. Control circuitry 112 might temporarily store the extra parity bits in RAM or other memory for faster access once read from cache memory 120. In some examples, a portion of cache memory 120 can comprise RAM or volatile memory into which the extra parity bits can be stored during operation of decoder 151. These extra parity bits can be periodically backed up to non-volatile memory in other portions of cache memory 120 to provide storage of the extra parity bits during power interruptions.

In the second example augmentation type, decoder 151 retrieves (208) extra parity bits 122 from cache memory 120 (which were computed previously responsive to prior decoding errors) and configures decoder 151 with at least a portion of extra parity bits 122. Decoder 151 employs the extra parity bits in the decode process by adding extra ECC decode equations corresponding to the extra parity bits. This extra parity and extra ECC decode equations can aid in convergence onto corrected bit values during the decode process. The quantity of extra parity bits can vary, and the size of encoded data segments read from storage media 130 can vary. However, in a specific example, normal parity stored with the encoded data segments on storage media 130 might comprise 400 bytes of parity per encoded data segment. The encoded data segments might each be 4 kilobytes (4 KB) in size. The extra parity bits can be 200 bytes per encoded data segment, and the extra parity bits supplement the normal parity bits and are stored separately from the normal parity and encoded data segments. Thus, the extra parity bits are not stored with the data on storage media 130 in this example. Moreover, a small volatile memory, such as a RAM sized small relative to storage media 130, can be used to store the extra parity for fast retrieval of the extra parity by decoder 151.

After the augmented decoding of further encoded data segments read from storage media 130 into associated decoded data, this data can be provided to the requesting entities over link 160. Moreover, control circuitry 112 monitors further errors encountered during decoding of the further encoded data segments. Responsive to these further errors, control circuitry 112 updates (210) the information relating to the errors. In the first example augmentation type, control circuitry 112 updates the error locations indicated by the error location index in error tracking structures 121. In the second example augmentation type, further parity calculations can occur for extra parity and updated into cache memory 120. The further parity calculations might be prompted in response to additional or new errors encountered for encoded data segments during decode processes, or according to one or more further error thresholds.

To enhance the update process for the error location index, a further process can be employed by control circuitry 112. This process includes calculating an initial checksum held in cache memory 120 for the present error location index. After each augmented decode of an encoded data segment, a further checksum can be calculated on error locations encountered. This further checksum can be compared to the initial checksum. When the checksums differ, then control circuitry 112 can update the error location index with new or updated error locations encountered during augmented decode. The differing checksum can also be updated to replace the existing checksum in cache memory 120. When the checksums do not differ, then no updating of the error location index or checksum is needed.

Advantageously, decoding operations of a storage device, storage drive, or other storage element can be enhanced by employing an error location index with optional extra parity bits stored separately from the encoded data. A first example of augmented decode can include initializing reliability parameters of a decoder to enhance a decode process. A second example of augmented decode can include using extra parity bits to initiate extra decoding equations and enhance the decode process. Each augmentation type has associated advantages, but are both typically equivalent from an entropy standpoint. The first example augmentation relies upon correlated errors occurring in similar bit locations over time, as might be encountered for physical defects in storage media. The second example does not rely upon correlated errors, and thus might be more effective against random bit errors. Both augmentation types might be employed, or only one type might be selected based on anticipated error types.

Moreover, storage media 130 might be subdivided into one or more special "read-enhanced" zones or subsets. This is indicated in FIG. 1 as read-enhanced zone 131, which corresponds to a particular storage address range or logical block address range of storage media 130. Read-enhanced zone 131 can be established to reduce latency on data expected to experience many read requests in a particular period of time. Read operations received over link 160 can be checked against an address range by control circuitry 112 to determine if the read operation corresponds to the read-enhanced portion of the storage media, such as read-enhanced zone 131. If the read operations are directed to read-enhanced zone 131, then the augmented decoding scheme can be employed. If the read operations are not directed to read-enhanced zone 131, then the augmented decoding scheme is not applied.

In the content server examples above, a portion of a storage drive or storage device might be designated for handling content which is expected to be read by users frequently. This portion can be a read-enhanced portion, and thus have the augmented decoding performed and experience a reduced latency as compared to non-read-enhanced portions of the storage device. Further DRAM caching of the data held by the read-enhanced portions need not be performed, as the latency and performance can meet the needs of the read requests on-the-fly. Thus, a server might be able to significantly reduce usage of DRAM hardware for serving content to end users, while decreasing latency for that content. Moreover, being volatile memory, DRAM is vulnerable to power interruptions and failures. However, the augmented decoding for read-enhanced portions of the storage media can advantageously operate regardless of power interruptions, as the error location indexes can be stored to non-volatile memory and content is served without having to build up cache data presence via cache hits/misses for normal DRAM cache structures.

Figure 3:
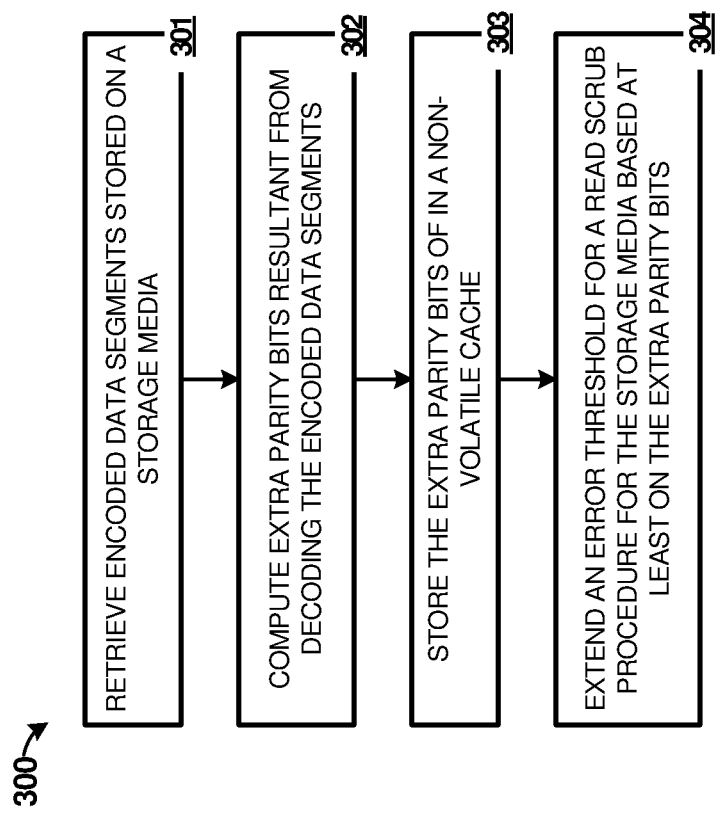
FIG. 3 illustrates an example operation of a data storage system.

Turning now to a more detailed discussion on using error tracking structures to enhance read scrub operations, FIG. 3 is presented. FIG. 3 is a flow diagram illustrating an example operation of elements of system 100 in FIG. 1. The operations of FIG. 3 are discussed in the context of elements of FIG. 1. However, it should be understood that the operations of FIG. 3 can instead be employed by any of the various storage system examples herein. FIG. 3 details one example process for augmenting read scrub operations. In FIG. 3, control circuitry 112 or media interface 113 of FIG. 1 might execute read scrub operations. For sake of example, control circuitry 112 will be discussed below.

A read scrub process occurs on various types of storage media, such as NAND flash media, among others. The read scrub process normally moves data from a first location on the storage media to a different portion of the storage media to alleviate degradation of the data due to physical errors of the storage media. For example, when too many errors are encountered for a region of storage, such as a page, then that region of storage can be moved to another physical location. Certain types of ECC or quantity of parity bits stored with encoded data segments can compensate for a limited quantity of errors in data stored on the storage media. When a threshold quantity of errors is reached, then the affected data must be moved to another physical portion of the storage media or risk data loss. This is a normal part of media maintenance activities performed in many storage media. However, when separate extra parity bits are employed, such as discussed above for operation 208, this read scrub process can also be augmented. Specifically, a read scrub threshold can be extended using extra parity bits 122.

Control circuitry 112 retrieves (301) encoded data segments stored on storage media 130. This retrieval can be responsive to read operations received over link 160, among other operations. Control circuitry 112 then computes (302) extra parity bits resultant from decoding the encoded data segments, such as discussed in operation 202 of FIG. 2. Control circuitry 112 also stores (303) the extra parity bits of the error locations in a non-volatile cache memory, namely non-volatile portions of cache memory 120. These extra parity bits are typically computed responsive to a quantity of errors encountered during decode of encoded data segments exceeding a threshold quantity of errors. In many examples, the extra parity bits are stored separately from the encoded data segments. Specifically, the extra parity bits can be stored as extra parity 122 in cache memory 120. Control circuitry 112 then extends (304) an error threshold for a read scrub procedure for storage media 130 based at least on the extra parity bits.

Since the extra parity is calculated on a per-encoded data segment basis, then each encoded data segment has extra parity in cache memory 120 to augment any parity stored with the encoded data segments on storage media 130. A read scrub procedure can be initiated responsive to a quantity of errors reaching or exceeding an error threshold for a particular memory page of storage comprising a plurality of encoded data segments. However, since extra parity bits are computed for certain encoded data segments, as discussed herein, then this error threshold can be extended outward in time to encompass a larger quantity of errors for an associated memory page.

On a per-encoded data segment basis, 400 bytes might be stored with the encoded data segment. A further 200 bytes of extra parity might be stored in cache memory 120 for that encoded data segment, and thus a total of 600 bytes of parity can exist for that encoded data segment. When several such encoded data segments have extra parity, then an associated memory page can tolerate more physical media defects than a memory page without the extra parity. In yet further examples, an error location index discussed herein can be used as a read scrub threshold indicator. When a threshold level of bits are indicated as having experienced past errors in the error location index, then the read scrub process can be initiated for the storage portion covered by the error location index.

Since read scrub operations consume much bandwidth of a storage device or storage media, delaying or preventing read scrubs for certain memory pages in read-enhanced portions of a storage media can greatly increase overall performance and throughput of an affected storage device. Moreover, if the extra parity bits are stored in a non-volatile memory, then the enhanced read scrub operations can withstand power interruptions and power failures. In further examples, the extra parity bits can be stored on storage media 130.

Returning to a discussion on the elements of FIG. 1, storage controller 110 and storage media 130 together can form storage device 140. Storage device 140 can comprise a storage drive formed from the interfacing, control, and storage elements of FIG. 1. Moreover, any storage media type might be employed to form storage device 140. Elements of storage controller 110 can each comprise logic circuitry, processing devices, transceiver circuitry, storage elements, among other elements. Discrete electronics, logic circuitry, and other circuitry might be employed to form elements of storage controller 110. In other examples, portions of storage controller 110 might be implemented in various integrated circuits, such as processing systems, microcontrollers, microprocessors, field-programmable gate arrays (FPGA), application-specific integrated circuits (ASIC), or other integrated systems.

Host interface 111 includes one or more communication interfaces or network interfaces for coupling storage device 140 over link 160. Host interface 111 can include transceiver circuitry, buffer circuitry, protocol conversion circuitry, interface conversion circuitry, and other related circuitry. The communication interfaces can include peripheral component interconnect express (PCIe) interfaces, NVM Express (NVMe) or Non-Volatile Memory Host Controller Interface Specification (NVMHCIS) interfaces, SDcard interfaces, universal serial bus (USB) interfaces, serial AT attachment (SATA), I/O Controller Hub (ICH) interfaces, Platform Controller Hub (PCH) interfaces, HyperTransport (HT) interfaces, InfiniBand interfaces, FibreChannel interfaces, Ethernet interfaces, serial interfaces, serial peripheral interface (SPI) links, inter-integrated circuit (I2C) interfaces, universal asynchronous receiver-transmitter (UART) interfaces, wireless interfaces, or one or more local or wide area network communication interfaces which can communicate over Ethernet or Internet protocol (IP) links.

Control circuitry 112 may comprise a microprocessor and processing circuitry that retrieves and executes software from one or more storage systems. Control circuitry 112 may be implemented within a single processing device, but may also be distributed across multiple processing devices, subsystems, or specialized circuitry, that cooperate in executing program instructions and in performing the operations discussed herein. Examples of control circuitry 112 include general purpose central processing units, application specific processors, and logic devices, as well as any other type of processing device, combinations, or variations thereof.

Control circuitry 112 also comprises one or more encoder and decoder circuits, namely encoder 150 and decoder 151. The encoder circuits comprise encoding engines that encode data into encoded data segments using an error correcting code for storage onto storage media 130. The decoder circuits comprise decoding engines that decode encoded data segments read from storage media 130 into decoded data segments. Control circuitry 112 can be configured to employ various error correcting codes and error correction schemes. The encoder circuits can calculate parity information, checksum information, and other redundancy data and data protection information. Moreover, the decoder circuits can be augmented by error tracking information determined during one or more prior decode operations and stored in cache memory 120.

Media interface 113 comprises circuitry to interface with and control specific storage media types employed, such as flash interfaces, Open NAND Flash Interfaces (ONFI), "toggle" command protocol interfaces, magnetic random-access memory (MRAM) interfaces, resistive random-access memory (ReRAM) interfaces, among others. Media interface 113 can include control circuitry to perform media access, media writes, media reads, garbage collection, read scrub operations, partitioning, and logical-to-physical address translation. Media interface 113 can also track logical-to-physical address translations and media defects, such as physical errors, using one or more data structures stored in various non-volatile memory devices.

Cache memory 120 comprises one or more data storage devices, which might comprise non-volatile portions. Cache memory 120 includes interfacing elements, control elements, and non-transitory storage media elements. Elements of cache memory 120 can be separate as shown in FIG. 1, or instead might be combined to form unified circuit elements with other elements of storage controller 110. Cache memory 120 might comprise any of the non-volatile storage media discussed herein, such as flash memory, MRAM, ReRAM, or other storage media types.

Storage media 130 may comprise any computer-readable storage media. Storage media 130 may include volatile and nonvolatile storage media, removable and non-removable storage media implemented in any technology for storage of information, such as computer readable instructions, data structures, program modules, or other data. Examples of storage media include NAND/NOR flash memory, magnetic disks, hard disk drives (HDDs), solid-state storage drives (SSDs), hybrid disk drives, 3D XPoint storage, magnetic random-access memory (MRAM), phase-change memory (PCM), resistive random-access memory (ReRAM), memristor memory, optical disks, magnetic cassettes, magnetic tape, or other magnetic storage devices, or any other suitable storage media. Storage media 130 can comprise one or more physical storage media elements, which might include memory/storage dies or memory/storage chips divided into one or more logical partitions.

Link 160 comprises various peripheral or storage links, such as PCIe links, NVMe links, SDcard links, universal serial bus (USB) links, I/O Controller Hub (ICH) links, Platform Controller Hub (PCH) links, HyperTransport (HT) links, or InfiniBand links, Thunderbolt links, Ethernet links, or packet network links, among others. Link 161 can include one or more Open NAND Flash Interface (ONFI) links (synchronous or asynchronous) or "toggle" command protocol links when NAND flash media is employed. Other link types and compositions can be employed for other media types. Various electrical or optical transport elements can be included in links 160-161, such as conductive traces, optical waveguides, or wireless links for interconnecting the various elements indicated.

Figure 4:
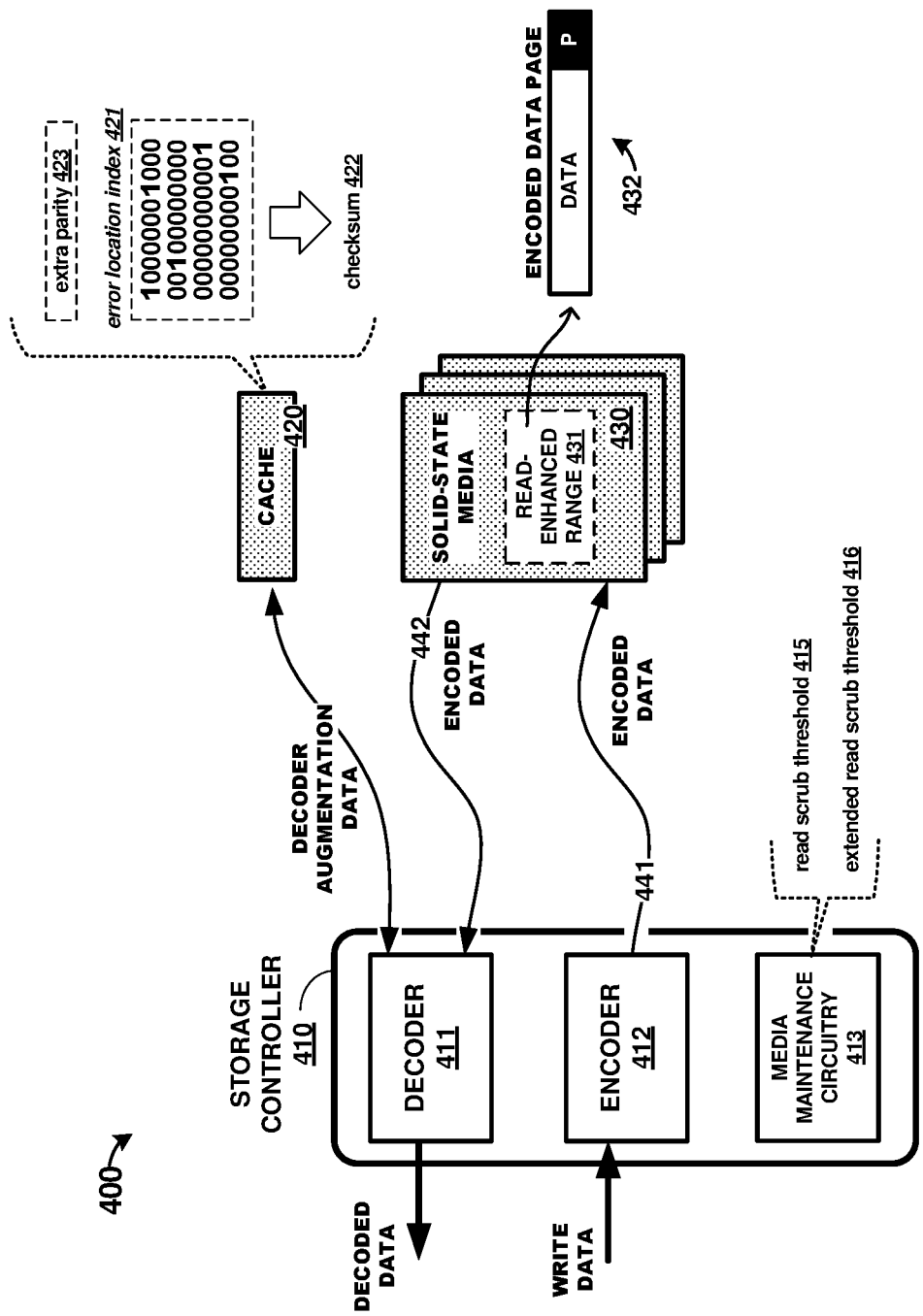
FIG. 4 illustrates an example data storage system.

Turning now to a further example of enhanced error correction and data protection, FIG. 4 is presented. FIG. 4 illustrates example data storage system 400. Data storage system 400 includes storage controller 410, cache 420, and solid-state storage media 430. Storage controller 410, cache 420, and solid-state storage media 430 might comprise a storage drive, storage device, solid state drive (SSD), or other device for storing and retrieval of data. Individual links are not shown in FIG. 4 for clarity. Instead, a functional view of data flow and operational communication is shown to emphasize inter-operation of elements of data storage system 400. It should be understood that various communication/data links can be employed, such as those discussed in FIG. 1 for links 114-116 and 160-161.

Storage controller 410 includes decoder 411, encoder 412, and media maintenance circuitry 413. Storage controller 410 comprises control elements and circuitry, such as discussed for storage controller 110 in FIG. 1, although variations are possible. Cache 420 comprises one or more volatile memory portions and non-volatile memory portions. Solid-state storage media 430 comprises non-volatile memory elements.

Typically, storage media will have a minimum access size for data, such as a segment defined by a page, block, or other distinction. For flash memory, a 'page' can be the minimum access size for reads and writes, while a 'block' might be the minimum size for erase operations. Data maintenance activities, such as read scrubs, garbage collection, or wear leveling might affect different granularities in physical media portions. Thus, responsive to storage operations received into storage controller 410, an amount of data corresponding to a size indicated in the operation can be stored on or retrieved from storage media 430. This size corresponds to one or more granular pieces according to the data access size of the storage media, such as pages for flash memory. For the discussion of FIG. 4, the data access size is referred to as a data page or data segment, although variations are possible. An example encoded data page 432 is shown in FIG. 4.

In operation, storage controller 410 receives storage operations and interprets these storage operations for performing various data operations with regard to storage media 430. Storage controller 410 can respond with data or status messaging responsive to the received storage operations. For example, write data can be received with write commands or write operations from a host system, and this write data can be stored onto storage media 430 according to storage addressing that accompanies the write data. Prior to storing the write data, an encoding process is performed by encoder 412 which applies one or more ECC schemes and potentially calculates parity bits to accompany the write data on the storage media. Once the encoding process completes, encoded write data 441 is stored onto storage media 430 as one or more encoded data pages.

In this example, a portion of storage media 430 is dedicated to a read-enhanced storage portion indicated by read-enhanced range 431. Data written into this range can receive enhanced handling upon retrieval responsive to read operations. Read-enhanced storage range 431 can be defined by a range of logical block addresses (LBAs) or other designations. When read operations are received that correspond to this LBA range, then additional enhanced handling can be performed by storage controller 410. In particular, when read operations are received which correspond to read-enhanced range 431, then decoder 411 can perform one or more augmented decoding operations on encoded data pages to produce decoded data. Although read-enhanced range 431 can comprise a subset of the total storage space of storage media 430, it should be understood that the entire portion of storage media 430 might be employed for read-enhanced zones. One or more partitions might be established for storage media 430, with each partition having separately handled and stored error location indexes and extra parity bits if configured as read-enhanced partitions.

Example capacities or sizes for cache 420 depends in part on the size of read-enhanced range 431. Approximately speaking, overprovisioning for ECC in an example NAND flash storage media, such as storage media 430 can be about 12% (i.e. an extra 12% of memory cells are added to each memory page for storing these 'normal' parity bits. This overprovisioning is sufficient for correcting about 1.5% of bit errors in the data stored on storage media 430. However, if extra data protection is desired at 2% instead of at 1.5%, then ECC overprovisioning will need to be increased from ~12% to ~16% (i.e. increased by ~4%). This can correspond to an extra 640 bytes of ECC overprovisioning per each 16 KB memory page. Thus, to provide this extra protection for a read-enhanced partition of 100 MB, then cache 420 can be at least 4 MB in size, comprising either volatile DRAM or non-volatile memory. This size of cache 420 is quite smaller than the size needed for storing the actual data on storage media 430, as well as the ECC overprovisioning stored with the data on storage media 430.

An initial read operation directed to the read-enhanced storage range can be received into storage controller 410 which corresponds to one or more encoded data pages. Storage controller 410 performs an initial decode process using decoder 411 after retrieval of the one or more encoded data pages from storage media 430. This decode process typically corrects for errors encountered by the encoded data pages, either errors from storage, transit, or random errors which might affect portions of the encoded data pages. This decode process typically employs calculating decoded data using error correction schemes along with any corresponding parity bits stored with the data. Example error correction schemes include low-density parity-check (LDPC) types of error correcting codes (ECCs), among others, which can ensure reliable payload data storage despite random read/write errors, interfacing errors in media interface, and physical flaws in storage media. Decoded data resultant from decoder 411 is transferred to a requesting entity, such as a host system.

Also, during this initial decode, error locations within the encoded data page are monitored and tracked by storage controller 410. The error locations are noted by bit location within the encoded data page, and any associated metric to measure and track these locations can be employed. One possible example is shown for error location index 421 in FIG. 4. Error location index 421 indicates several bit vectors with '0' and '1' indicators. Although the length of the error vectors in error location index 421 are merely exemplary at 11 bits, it should be understood that different sizes can be employed to track error locations in encoded data pages. A '1' might indicate a location of an error encountered during the initial decode, while a '0' might indicate locations where no errors were encountered. Each row of error location index 421 can correspond to a different error vector and thus a corresponding data page. In flash media examples, each error vector can correspond to a page of data, while error location index can correspond to a plurality of pages. This plurality of pages can be an erase block size, or might be an amount of pages corresponding to the read-enhanced range of storage media 430.

Storage controller 410 stores the error vectors calculated for each initial decode of a data page in error location index 421. Error location index 421 is stored by cache 420, which can comprise volatile or non-volatile portions. When volatile portions are employed to store error location index 421, periodic backup or copying of error location index 421 to non-volatile portions can occur. This periodic backup can ensure persistence of error location index 421 over various failure modes such as power interruptions. Moreover, a size threshold can be established for backing up error location index 421. When a size threshold is reached or exceeded for error location index 421, then error location index 421 can be backed up from volatile memory to non-volatile memory.

Responsive to subsequent read operations received into storage controller 410 for which initial decodes have already been performed, storage controller 410 employs an augmented decoding process. For example, if a first storage location experiences a read operation for which an error vector has already been computed from a previous read, then the augmented decoding process is employed by decoder 411. In the first storage location experiences a read operation for which an error vector has not already been computed, then decoder 411 computes the error vector during decoding as mentioned above. This augmentation data represented by error location index 421, among other information, is used by decoder 411 to produce decoded data faster and more reliably than without the augmentation data. Thus, decoding of prior read operations inform decoding of later read operations to provide enhanced operation.

Specifically, during the decode process, decoder 411 is aided by at least a portion of error location index 421 retrieved from cache 420. A first example of aiding decoder 411 can include initializing reliability parameters of decoder 411 to enhance a decode process. A second example of aiding decoder 411 can include using extra parity bits or extra parity data to initiate extra decoding equations and enhance the decode process. The first example performs better with correlated errors occurring in similar bit locations over time, as might be encountered for physical defects in storage media. The second example can be more effective against random bit errors. Both types might be employed, or only one type might be selected based on anticipated error types, media properties, performance requirements, or other factors.

In the first example of aiding decoder 411, a decoding process of decoder 411 is configured using at least a portion of error location index 421 to initialize parameters for decoding of the further encoded data pages. Specifically, decoder 411 initializes reliability parameters for a LDPC ECC process of the decoding engine using the associated portion of error location index 421. These reliability parameters for the LDPC ECC process can be initialized with locations of previous errors from decoding previous encoded data pages, which are indicated as a high probability of further errors by using the error location index. The LDPC ECC process, among other ECC types, can inform a decoder which bits to decode and assign reliability of those bits. During decode, the reliability can indicate to decoder 411 to work on decoding those affected bits first, such as by flagging certain bit locations in data to be decoded before other bits. This flagging can aid in convergence to corrected bit values during the decode process. Thus, the associated portion of error location index 421 can indicate data byte locations in data stored on storage media 430, with bit offsets indicating locations of errors resultant from decoding one or more prior read operations. Subsequent reads to similar storage locations might produce similar errors, such as bit errors during decode. Knowledge of the locations of prior errors indicated by the error location index can be employed by decoder 411 to aid the decode process.

In the second example of aiding decoder 411, parity bits are calculated for pages within read-enhanced range 431 and stored in cache 420 as extra parity 423. This extra parity might be calculated responsive to detection of errors in encoded data pages during associated decoding. One or more error thresholds might be established which can prompt generation of the extra parity when exceeded by a quantity of errors encountered by decoder 411 for individual encoded data pages. This extra parity might instead be generated responsive to any initial decoding of encoded data pages within read-enhanced range 431. Thus, one or more extra parity bits are calculated for one or more of the encoded data pages in read-enhanced range 431. As with error location index 421, the extra parity bits can be stored by cache 420 for later retrieval. Decoder 411 retrieves the extra parity bits and performs a decode process using at least a portion of the extra parity bits to aid decoding of further encoded data pages. Storage controller 410 might temporarily store the extra parity bits in RAM or other memory for faster access once read from cache 420. In some examples, a portion of cache 420 can comprise RAM or volatile memory into which the extra parity bits can be stored during operation of decoder 411. These extra parity bits can be periodically backed up to non-volatile memory in other portions of cache 420 to provide storage of the extra parity bits during power interruptions.

To employ the extra parity bits, decoder 411 configures a decoding process with at least a portion of the extra parity bits that correspond to the encoded data page presently being decoded. Decoder 411 can add extra ECC decode equations corresponding to the extra parity bits in one example usage of the extra parity bits. These extra parity bits and extra ECC decode equations can aid in convergence onto corrected bit values during the decode process. The quantity of extra parity bits can vary, and the size of encoded data pages read from storage media 430 can vary. However, in a specific example, normal parity bits determined according to the ECC or other data correction scheme are stored with the encoded data pages on storage media 430, while the extra parity bits supplement the normal parity bits and are stored separately from the normal parity bits and encoded data pages. Thus, the extra parity bits are not typically stored with the data on storage media 430 in this example. Moreover, a small volatile memory, such as a RAM sized small relative to storage media 430, can be used to store the extra parity bits for fast retrieval of the extra parity bits by decoder 411.

After decoder 411 determines decoded data, aided by the error location index 421 or extra parity bits 423, this decoded data can be provided to requesting entities as read data. Moreover, decoder 411 monitors for different errors encountered during decoding of further encoded data pages. Responsive to these different errors, decoder 411 updates error location index 421 or generates further extra parity 423. Decoder 411 can compare a relevant portion of error location index 421 to current error locations for data being decoded. If differences are noticed among the portion of error location index 421 and the current error locations, then decode 411 can update error location index 421 to reflect these new error locations. Checksum value 422 can be employed to enhance the update process for error location index 421. Specifically, decoder 411 calculates an initial checksum value 422 held in cache 420 for a present decode process of an encoded data page. After each subsequent decode of encoded data pages to similar storage locations, a further checksum value can be calculated on error locations encountered for those subsequent decodes. This further checksum value can be compared to checksum value 422 stored in cache 420. When the checksums values differ, then decoder 411 can update error location index 421 with new or updated error locations encountered during decode. The differing checksum value can also be updated to replace an existing checksum value 422 in cache 420. When the checksum values do not differ, then no updating of error location index 421 or checksum value 422 is performed.

Advantageously, decoding operations of a storage device, storage drive, or other storage element can be enhanced by employing an error location index or extra parity bits stored separately from the encoded data. Systems which employ this enhanced decoding can use a small capacity DRAM or non-volatile memory for temporary caching of error location indexes and extra parity, but need not have a DRAM cache for caching of user data, requested data, payload data, encoded data pages, or decoded data. Thus, a host system which incorporates storage controller 410 and associated elements of system 400 can service repeated reads to read-enhanced range 431 without caching of data read from read-enhanced range 431. Latency for decoding data read from read-enhanced range 431 is low enough to directly service continual, repeated reads and decode on-the-fly. Both enhancements of using error vectors/indexes or extra parity bits can provide enhanced functionality as described. While usage of error vectors depends somewhat on error correlation among subsequent reads to similar storage locations, extra parity bits can better compensate for random or non-correlated errors.

Further benefits of using at least extra parity bits 423 stored in cache 420 is the enhancement of certain physical media maintenance operations for storage media 430, such as those performed by media maintenance circuitry 413. For example, storage media read scrubs are performed to ensure data reliability and integrity while stored on storage media 430. When a quantity of bit errors reaches or exceeds a designated threshold, a read scrub can be performed for the affected page or block of storage media 430. This read scrub moves the affected data from an initial storage location to another physically distinct storage location. This can be effective when physical defects of associated memory cells or memory circuitry exceed desired limits, leading to less reliable storage within those memory cells. Normal ECC overprovisioning or parity bits stored with the encoded data pages on storage media 430 can protect against some of these physical defects and thus a read scrub threshold is typically established based on the quantity of data protection stored with the data. This is indicated as read scrub threshold 415 in FIG. 4.

Using the extra overprovisioning held in cache 420, namely extra parity bits 423, a new read scrub threshold can be established. This new read scrub threshold is indicated by extended read scrub threshold 416 in FIG. 4. Extended read scrub threshold 416 is established by media maintenance circuitry 413, and reduces the quantity and frequency of read scrub operation needed to be performed for storage media 430. This can lead to greater throughput and performance of a storage drive that incorporates extended read scrub threshold 416, since read scrub operations consume the finite bandwidth of any affected storage drive or storage device. This finite bandwidth can be freed up to handle read and write operations more effectively using extended read scrub threshold 416.

Moreover, error location index 421 can be used to track when read scrub operations should be performed. Typically, media maintenance circuitry 413 will monitor storage media 430 to determine when data read from storage media 430 experiences too many errors, such as those exceeding read scrub threshold 415. In the enhanced examples herein, error location index 421 can be employed to indicate a quantity of errors in each associated memory page. Thus, error location index 421 not only serves to provide enhanced decoding with decoder 411, but also can serve to track a quantity of errors for media maintenance circuitry 413 to apply extended read scrub threshold 416 against.

Figure 5:
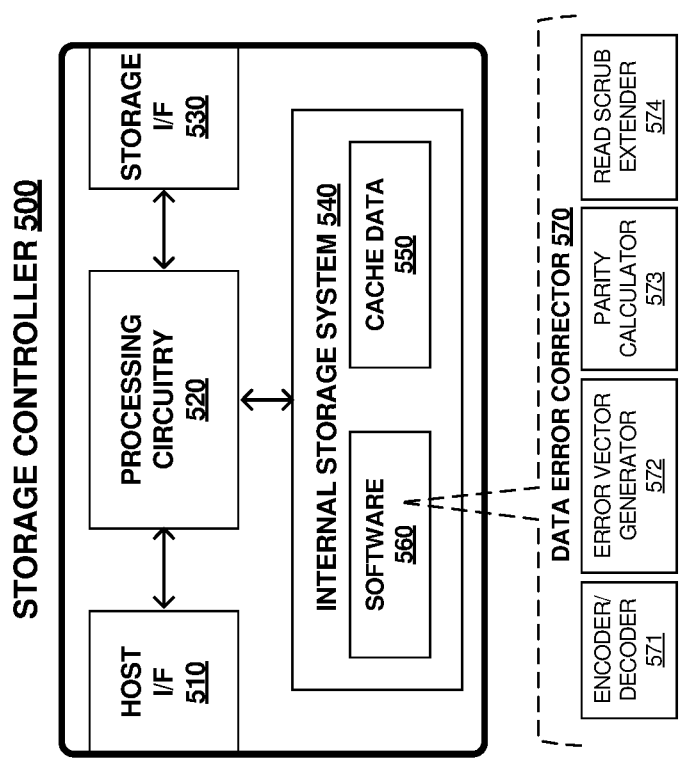
FIG. 5 illustrates a storage controller in an example implementation.

FIG. 5 illustrates storage controller 500. Storage controller 500 may take on any of a wide variety of configurations, and can form elements discussed herein for storage controller 110 of FIG. 1 or storage controller 410 of FIG. 4. Moreover, storage controller 500 can form elements discussed herein for control circuitry 112 and cache memory 120 of FIG. 1, or decoder 411, encoder 412, media maintenance circuitry 413, and cache 420 of FIG. 4, along with any associated interfaces and links. Here, an example configuration is provided for a storage controller implemented as an ASIC or field programmable gate array (FPGA). However, in other examples, storage controller 500 may be built into a storage device, storage drive, storage system, or storage array, or incorporated into a host system.

In this example, storage controller 500 comprises host interface 510, processing circuitry 520, storage interface 530, and internal storage system 540. Host interface 510 comprises circuitry configured to receive data and commands from external host systems and to send data to the host systems. Storage interface 530 comprises circuitry configured to send data and commands to storage media and to receive data from the storage media.

Processing circuitry 520 comprises electronic circuitry configured to perform the tasks of a storage controller as described herein. Processing circuitry 520 may comprise microprocessors and other circuitry that retrieves and executes software 560. Processing circuitry 520 may be embedded in a storage system in some examples. Examples of processing circuitry 520 include general purpose central processing units, application specific processors, and logic devices, as well as any other type of processing device, combinations, or variations thereof. Processing circuitry 520 can be implemented within a single processing device but can also be distributed across multiple processing devices or sub-systems that cooperate in executing program instructions.

Internal storage system 540 can comprise any non-transitory computer readable storage media capable of storing software 560 that is executable by processing circuitry 520. Internal storage system 540 can also include various data structures 550 which comprise one or more databases, tables, lists, caches, or other data structures. Storage system 540 can include volatile and nonvolatile, removable and non-removable media implemented in any method or technology for storage of information, such as computer readable instructions, data structures, program modules, or other data.

Storage system 540 can be implemented as a single storage device but can also be implemented across multiple storage devices or sub-systems co-located or distributed relative to each other. Storage system 540 can comprise additional elements, such as a controller, capable of communicating with processing circuitry 520. Examples of storage media include random access memory, read only memory, magnetic storage, optical storage, flash memory, virtual memory and non-virtual memory, or any other medium which can be used to store the desired information and that can be accessed by an instruction execution system, as well as any combination or variation thereof.

Software 560 can be implemented in program instructions and among other functions can, when executed by storage controller 500 in general or processing circuitry 520 in particular, direct storage controller 500, or processing circuitry 520, to operate as described herein for a storage controller. Software 560 can include additional processes, programs, or components, such as operating system software, database software, or application software. Software 560 can also comprise firmware or some other form of machine-readable processing instructions executable by elements of processing circuitry 520.

In at least one implementation, the program instructions can include data error corrector 570. Data error corrector 570 is configured to provide enhanced, low-latency decoding for data written in an encoded format onto storage media. In this example, data error corrector 570 includes encoder/decoder 571, error vector generator 572, parity calculator 573, and read scrub extender 574.

Encoder/decoder 571 includes instructions to encode data using an ECC scheme for storage onto storage media over storage interface 530. This ECC scheme can include encoding unencoded data into an encoded form and applying ECC protection using parity bits or other forms of data protection. Encoder/decoder 571 can apply various data redundancy schemes to store encoded data as well. Encoder/decoder 571 can also read data from a storage media over storage interface 530 and decode this data into decoded data. Encoder/decoder 571 applies one or more ECC schemes to decode the data, and can apply parity data stored with the data on the storage media. Encoder/decoder 571 also determines errors encountered while decoding the data, such as bit errors in an ECC process which are corrected ultimately using the ECC scheme. Encoder/decoder 571 indicates locations of these errors within the data being decoded for tracking by error vector generator 572.

Error vector generator 572 includes instructions to establish various tracking data structures for tracking locations of bit errors encountered during decode of data by encoder/decoder 571. Error vector generator 572 can store these tracking data structures in cache data 550 of storage controller 500, or in other storage devices. Error vector generator 572 can provide portions of these tracking data structures to encoder/decoder 571 during subsequent data decoding to aid, augment, or otherwise enhance decoding operations of encoder/decoder 571. Various examples are included herein on this decoding enhancement. Error vector generator 572 can also compare new error locations found during decoding operations to existing/old error locations indicated in the tracking data structures. When differences are found, such as new errors encountered in decoding processes, then error vector generator 572 can update the tracking data structures with indications of the new error locations.

Parity calculator 573 can also be employed along with error vector generator 572 or in lieu of error vector generator 572. Parity calculator 573 includes instructions to calculate parity bits or other overprovisioning data for data read from the storage media to aid, augment, or otherwise enhance decoding operations of encoder/decoder 571. These extra parity bits can be generated responsive to bit errors found which exceed a bit error threshold, or might instead be calculated for every data page/segment read from the storage media which is to receive enhanced decoding treatment. The extra parity bits are stored in cache data 550 by parity calculator 550, and provided to encoder/decoder 571 when employed in decoding processes, as described herein.

Read scrub extender 574 includes instructions to employ at least the extra parity bits determined by parity calculator 573. Read scrub extender 574 establishes new read scrub thresholds based on the quantity of extra parity bits stored in cache 550 and the data affected by the extra parity bits stored in cache 550. These new read scrub thresholds can reduce the frequency of read scrub operations and provide for higher throughput of a storage media to service user data operations instead of physical media maintenance activities.

In general, software 560 can, when loaded into processing circuitry 520 and executed, transform processing circuitry 520 overall from a general-purpose computing system into a special-purpose computing system customized to operate as described herein for a storage controller, among other operations. Encoding software 560 on internal storage system 540 can transform the physical structure of internal storage system 540. The specific transformation of the physical structure can depend on various factors in different implementations of this description. Examples of such factors can include, but are not limited to, the technology used to implement the storage media of internal storage system 540 and whether the computer-storage media are characterized as primary or secondary storage.

For example, if the computer-storage media are implemented as semiconductor-based memory, software 560 can transform the physical state of the semiconductor memory when the program is encoded therein. For example, software 560 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

In some implementations of the systems, circuitry, and elements discussed herein, an enhanced data error corrector is established. The data error corrector can comprise data protection circuitry and decoder circuitry, among other circuitry. The data error corrector can include a means for generating information relating to errors resultant from decoding at least an initial encoded data segment with a decoding scheme. The data error corrector can include a means for revising the decoding scheme based at least in part on the information. The data error corrector can include a means for decoding a subsequent encoded data segment into a decoded data segment with the revised decoding scheme, and means for transmitting the decoded data segment. The data error corrector can further include a means for selecting among at least one of a first augmentation operation and a second augmentation operation for revising the decoding scheme, where the first augmentation operation comprises supplementing parity bits included in the subsequent encoded data segment with at least parity bits computed for the error locations, and where the second augmentation operation comprises initializing reliability parameters for the decoding scheme using an error vector that indicates error locations resultant from decoding at least the initial encoded data segment with the decoding scheme.

The means for generating information relating to errors resultant from decoding at least an initial encoded data segment with a decoding scheme, means for revising the decoding scheme based at least in part on the error vector, means for decoding a subsequent encoded data segment into a decoded data segment with the revised decoding scheme, and means for selecting among at least one of a first augmentation operation and a second augmentation operation for revising the decoding scheme can comprise any of storage controller 110, control circuitry 112, cache memory 120, links 114-116 and 161 of FIG. 1, storage controller 410, decoder 411 and cache 420 of FIG. 4, or processing circuitry 520, storage interface 530, internal storage system 540, software 560, and cache data 550 of FIG. 5, among other elements. The means for transmitting the decoded data segment can comprise any of host interface 111, link 160, storage controller 110, control circuitry 112, cache memory 120, links 114-116 of FIG. 1, storage controller 410, decoder 411 and cache 420 of FIG. 4, or host interface 510, processing circuitry 520, or software 560 of FIG. 5, among other elements.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. An apparatus, comprising:
a storage media configured to store encoded data;
a cache memory configured to store information relating to errors, comprising at least one error location index indicating decoding error location information relating to at least a portion of the encoded data, resultant from decoding one or more prior read operations directed to the encoded data; and
a decoder configured to decode the encoded data retrieved from the storage media, the decoding augmented by the information relating to the errors.

2. The apparatus of claim 1, wherein the decoder is further configured to:
augment decoding of the encoded data by at least initializing reliability parameters in a low-density parity-check (LDPC) scheme with the error location information indicated in the at least one error location index.

3. The apparatus of claim 1, wherein the decoder is further configured to:
determine further error location information resultant from decoding the encoded data; and
based at least on the further error location information differing from the at least one error location index, update the at least one error location index with the further error location information.

4. The apparatus of claim 3, wherein the decoder is further configured to:
retrieve checksum data computed for the at least one error location index; and
compare the checksum data to new checksum data computed for the further error location information to determine when the further error location information differs from the at least one error location index.

5. The apparatus of claim 1, wherein the information relating to the errors comprises at least parity bits computed responsive to decoding the one or more prior read operations; and
wherein the decoder is further configured to:
retrieve the parity bits from the cache memory; and
augment the decoding of the encoded data using at least the parity bits to add one or more error correcting elements in a low-density parity-check (LDPC) scheme.

6. The apparatus of claim 5, further comprising:
a read scrubber configured to extend a read scrub threshold for the storage media based at least on the parity bits.

7. An apparatus, comprising:
a storage media comprising a read enhanced portion;
a host interface; and
a storage controller configured to:
receive read operations over the host interface directed to the read enhanced portion of the storage media;
configure decode parameters for the read operations based at least on errors resultant from decoding one or more prior read operations directed to the read enhanced portion; and
decode data retrieved from the read enhanced portion of the storage media.

8. The apparatus of claim 7, wherein the storage controller is configured to configure the decode parameters based on an error vector comprising error locations resultant from the one or more prior read operations directed to the read enhanced portion.

9. The apparatus of claim 8, wherein the storage controller is configured to maintain the error vector in a cache memory separate from the storage media.

10. The apparatus of claim 8, wherein the storage controller is configured to compare checksum data for the error vector to new checksum data computed for the error vector updated to reflect bit errors from a present decode to determine when to update the error vector.

11. The apparatus of claim 8, wherein the storage controller is configured to aid decode of the data by at least initializing reliability decode parameters for a low-density parity-check (LDPC) decoding scheme using the error locations indicated in the error vector.

12. The apparatus of claim 7, wherein the storage controller is configured to compute and store parity bits responsive to a quantity of the errors resultant from decoding the one or more prior read operations exceeding an error threshold.

13. The apparatus of claim 12, comprising:
the storage controller configured to store the parity bits from a cache memory separate from the storage media.

14. The apparatus of claim 12, comprising:
the storage controller configured to extend a read scrub threshold for the read enhanced portion of the storage media based at least on the parity bits.

15. A method, comprising:
retrieving a first encoded data segment stored on a storage media;
computing information relating to errors, comprising an indication of error locations resultant from decoding the first encoded data segment;
storing the information relating to the errors in a cache;
retrieving a second encoded data segment stored on the storage media;
configuring a decoding engine using at least the information relating to errors retrieved from the cache; and
decoding the second encoded data with the decoding engine to produce resultant data.

16. The method of claim 15,
further comprising:
initializing reliability parameters for a low-density parity-check (LDPC) function of the decoding engine using the indication of the error locations.

17. The method of claim 15, wherein the information comprises parity bits computed responsive to a quantity of the errors resultant from decoding the first encoded data segment exceeding an error threshold; and
further comprising:
retrieving the parity bits from the cache; and
configuring the decoding engine with the parity bits.

18. The method of claim 17, further comprising:
extending an error threshold for a read scrub procedure for the storage media based at least on the parity bits.

19. A storage device, comprising:
a storage media configured to store encoded data;
a host interface configured to receive read requests for data stored by the storage device;
a cache memory configured to store an error vector; and
a storage controller configured to:
retrieve first encoded data from the storage media responsive to a first read request;
decode the first encoded data and identify resultant error locations;
update the error vector with the resultant error locations;
configure an error correction decoder using the error vector;

retrieve second encoded data from the storage media responsive to a second read request;

decode the second encoded data into decoded data with the error correction decoder; and transfer the decoded data over the host interface.

20. The storage device of claim 19, wherein the storage controller is configured to supplement parity bits included in the second encoded data with at least parity bits computed based on resultant error locations of the first encoded data.

21. The storage device of claim 19, wherein the storage controller is configured to initialize reliability parameters for a low-density parity-check (LDPC) function of the error correction decoder with the resultant error locations.

22. The storage device of claim 19, wherein the storage controller is configured to:

compare checksum data computed for the error vector stored in the cache memory to new checksum data computed for error locations resultant from decoding the second encoded data; and based at least on a difference indicated by the comparison, update the error vector to reflect bit errors and store the new checksum data in the cache memory.

23. A data error corrector, comprising:

means for generating information relating to errors resultant from decoding at least an initial encoded data segment with a decoding scheme;

means for revising the decoding scheme based at least in part on the information;

means for decoding a subsequent encoded data segment into a decoded data segment with the revised decoding scheme;

means for transmitting the decoded data segment; and means for selecting among at least one of a first augmentation operation and a second augmentation operation for revising the decoding scheme;

wherein:

the first augmentation operation comprises supplementing parity bits included in the subsequent encoded data segment with at least parity bits computed for the initial encoded data segment;

the second augmentation operation comprises initializing reliability parameters for the decoding scheme using an error vector that indicates error locations resultant from decoding at least the initial encoded data segment with the decoding scheme.

24. An apparatus, comprising:

a storage media configured to store encoded data;

a cache memory configured to store information relating to errors, comprising at least parity bits computed responsive to decoding one or more prior read operations directed to the encoded data; and a decoder configured to:

retrieve the parity bits from the cache memory, and decode the encoded data retrieved from the storage media, the decoding augmented by using at least the parity bits to add one or more error correcting elements in a low-density parity-check (LDPC) scheme.

25. A method, comprising:

retrieving a first encoded data segment stored on a storage media;

computing information relating to errors, comprising parity bits computed responsive to a quantity of the errors resultant from decoding the first encoded data segment exceeding an error threshold;

storing the information relating to the errors in a cache;

retrieving a second encoded data segment stored on the storage media;

configuring a decoding engine using at least the information relating to errors retrieved from the cache; and decoding the second encoded data with the decoding engine to produce resultant data.

\* \* \* \* \*